United States Patent
Yang et al.

(10) Patent No.: US 7,419,888 B2
(45) Date of Patent: Sep. 2, 2008

(54) METHOD OF FORMING A SILICON-RICH NANOCRYSTALLINE STRUCTURE BY AN ATOMIC LAYER DEPOSITION PROCESS AND METHOD OF MANUFACTURING A NON-VOLATILE SEMICONDUCTOR DEVICE USING THE SAME

(75) Inventors: Sang-Ryol Yang, Gyeonggi-do (KR); Kyong-Hee Joo, Gyeonggi-do (KR); In-Seok Yeo, Seoul (KR); Ki-Hyun Hwang, Gyeonggi-do (KR); Seung-Hyun Lim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 201 days.

(21) Appl. No.: 11/494,451

(22) Filed: Jul. 28, 2006

(65) Prior Publication Data

US 2007/0066083 A1     Mar. 22, 2007

(30) Foreign Application Priority Data

Jul. 29, 2005 (KR) .................. 10-2005-0069371
May 17, 2006 (KR) .................. 10-2006-0044141

(51) Int. Cl.
H01L 21/20 (2006.01)
H01L 21/36 (2006.01)

(52) U.S. Cl. .................. 438/479; 438/257; 438/778; 438/962; 117/84; 118/715; 427/248.1; 427/255.28

(58) Field of Classification Search .................. 438/257, 438/479, 788, 962; 257/E21.212; 117/84–89, 117/92; 118/715; 427/248.1, 255.28
See application file for complete search history.

(56) References Cited

U.S. PATENT DOCUMENTS

| 5,481,128 | A | 1/1996 | Hong |
| 5,726,070 | A | 3/1998 | Hong et al. |
| 5,763,937 | A | 6/1998 | Jain et al. |
| 6,218,314 | B1 * | 4/2001 | Lin ............................. 438/761 |
| 6,221,793 | B1 * | 4/2001 | Ngo et al. .................... 438/788 |
| 6,274,429 | B1 | 8/2001 | Misra |
| 6,400,610 | B1 * | 6/2002 | Sadd ....................... 365/185.29 |
| 6,458,722 | B1 | 10/2002 | Kapoor et al. |

(Continued)

FOREIGN PATENT DOCUMENTS

| JP | 2004083299 | 3/2004 |
| KR | 19957026 | 3/1995 |
| KR | 1020040107354 A | 12/2004 |
| KR | 1020050030780 A | 3/2005 |

*Primary Examiner*—Ha Nguyen
*Assistant Examiner*—Daniel Whalen
(74) *Attorney, Agent, or Firm*—Volentine & Whitt, PLLC

(57) ABSTRACT

In a method of forming a silicon-rich nanocrystalline structure by an ALD process, a first gas including a first silicon compound is provided onto an object to form a silicon-rich chemisorption layer on the object. A second gas including oxygen is provided onto the silicon-rich chemisorption layer to form a silicon-rich insulation layer on the object. A third gas including a second silicon compound is provided onto the silicon-rich insulation layer to form a silicon nanocrystalline layer on the silicon-rich insulation layer. The first gas, the second gas and the third gas may be repeatedly provided to alternately form the silicon-rich nanocrystalline structure having a plurality of silicon-rich insulation layers and a plurality of silicon nanocrystalline layers on the object.

35 Claims, 5 Drawing Sheets

U.S. PATENT DOCUMENTS

| | | |
|---|---|---|
| 6,774,061 B2 | 8/2004 | Coffa et al. |
| 6,962,876 B2 * | 11/2005 | Ahn et al. .................. 438/680 |
| 7,101,760 B1 * | 9/2006 | Lojek ........................ 438/260 |
| 7,148,106 B2 * | 12/2006 | Joo et al. .................... 438/257 |
| 2003/0235064 A1 * | 12/2003 | Batra et al. ................ 365/100 |
| 2004/0018694 A1 * | 1/2004 | Lee et al. ................... 438/400 |
| 2005/0148201 A1 * | 7/2005 | Ahn et al. .................. 438/778 |
| 2006/0180845 A1 * | 8/2006 | Cha et al. .................. 257/314 |
| 2006/0246661 A1 * | 11/2006 | Joo et al. .................... 438/257 |
| 2007/0111546 A1 * | 5/2007 | Iyer et al. .................. 438/791 |
| 2007/0190768 A1 * | 8/2007 | Sato et al. .................. 438/592 |

* cited by examiner

METHOD OF FORMING A SILICON-RICH NANOCRYSTALLINE STRUCTURE BY AN ATOMIC LAYER DEPOSITION PROCESS AND METHOD OF MANUFACTURING A NON-VOLATILE SEMICONDUCTOR DEVICE USING THE SAME

CROSS-REFERENCE TO RELATED APPLICATION

This application claims priority under 35 USC §7 119 to Korean Patent Application No. 2005-69371 filed on Jul. 29, 2005 and Korean Patent Application No. 2006-44141 filed on May 17, 2006, the contents of which are herein incorporated by reference in their entirety for all purposes.

BACKGROUND OF THE INVENTION

1. Field of the Invention

Example embodiments of the present invention relates to a method of forming a silicon-rich nanocrystalline structure and a method of manufacturing a non-volatile semiconductor device using the same. More particularly, example embodiments the present invention relates to a method of forming a silicon-rich nanocrystalline structure by an atomic layer deposition (ALD) process, and a method of manufacturing a non-volatile semiconductor device using the same.

2. Description of the Related Art

Generally, semiconductor memory devices are classified into volatile semiconductor memory devices such as dynamic random access memory (DRAM) devices and static random access memory (SRAM) devices that lose data stored therein as time elapses, and non-volatile semiconductor memory devices such as read only memory (ROM) devices that continuously possess data stored therein regardless of time. Further, the data may be relatively rapidly inputted/outputted into/from the volatile semiconductor memory devices. On the contrary, the data may be relatively slowly inputted/outputted into/from the non-volatile semiconductor memory devices. An electrically erasable and programmable read only memory (EEPROM) device and a flash memory device among the non-volatile semiconductor memory devices into which the data may be electrically inputted and from which the data may be electrically outputted have been widely used in current semiconductor memory devices.

The flash memory device usually includes a memory cell that has a vertically stacked gate structure. The vertically stacked gate structure includes a floating gate formed on a semiconductor substrate. The vertically stacked gate structure further includes at least one tunnel dielectric layer or dielectric interlayer, and a control gate formed over the floating gate or at a peripheral of the floating gate.

In the non-volatile semiconductor device including a memory cell that has the vertically stacked gate structure, hot electrons generated in a channel region may overcome an energy barrier of the tunnel dielectric layer, and then may be injected into the floating gate so that the memory cell may be programmed. When the hot electrons in the floating gate are removed by Fowler-Nordheim (FN) tunneling mechanism, the data programmed in the memory cell may be erased.

When a high voltage is applied to the control gate to cause a potential difference between a source region and a drain region, the hot electrons generated in the channel region adjacent to the drain region may overcome the energy barrier, and then may be injected into the floating gate. Further, when a high voltage is applied to the source region and a voltage of about 0V is simultaneously applied to the control gate and the semiconductor substrate, the hot electrons in the floating gate may be removed by the F-N tunneling mechanism between the source region and the floating gate.

However, there are problems in relation to the electron retention in the non-volatile semiconductor memory device having the vertically stacked gate structure. To maintain the data stored in the memory cell, the hot electrons in the floating gate are maintained. When defects such as pinholes exist in the tunnel dielectric layer, the hot electrons in the floating gate may come out through the defects.

Further, in the vertically stacked memory cell, a tunnel junction through which the hot electrons pass is formed by means of an insulation layer such as an oxide layer having a high energy barrier in a band diagram. Since the energy barrier with respect to the hot electrons is very high, it is required to reduce a thickness of the energy barrier for improving an electron-tunneling rate through the tunnel junction. Thus, the tunnel dielectric layer may have a precisely thin thickness. However, the formation of the tunnel dielectric layer having the thin thickness causes difficulty in manufacturing uniform semiconductor devices and causes inferior reliability of the tunnel dielectric layer.

Recently, to solve the above-mentioned problems regarding the vertically stacked gate structure, a non-volatile semiconductor memory device including a silicon-rich oxide layer as a charge trapping layer has been developed.

The silicon-rich oxide layer generally includes an oxide layer having numerous silicon nanocrystals therein. The silicon nanocrystals in the silicon-rich oxide layer serve as a floating gate of the non-volatile semiconductor device.

The silicon nanocrystals trap or detrap hot electrons by tunneling mechanism. Additionally, the silicon nanocrystals are electrically separated from one another. While the non-volatile semiconductor memory cell is programmed, the electrons are injected into the silicon nanocrystals of the silicon-rich oxide layer. Since the silicon nanocrystals are electrically separated, electro-migration between the silicon nanocrystals may be restricted. Thus, although defects are partially generated in silicon-rich oxide layer, a leakage current caused by the defects may not affect on the electrons trapped in the silicon nanocrystals in the silicon-rich oxide layer.

In the non-volatile semiconductor memory device :including the silicon-rich oxide layer having the silicon nanocrystals, a multi-state memory cell for storing at least one data bit therein may be embodied using a variation of a threshold voltage accompanied with one electron stored in one silicon nanocrystal.

The silicon-rich oxide layer may be formed using a silane $(SiH_4)$ gas and a nitrous oxide $(N_2O)$ gas through a low pressure chemical vapor deposition (LPCVD) process, a plasma enhanced chemical vapor deposition (PECVD) process or a silicon implantation process. For example, a method of forming the silicon-rich oxide layer is disclosed in U.S. Pat. No. 6,274,429 (issued to Sudhanshu), U.S. Pat. No. 5,726,070 (issued to Hong), U.S. Pat. No. 5,763,937 (issued to Vivek), U.S. Pat. No. 6,774,061 (issued to Patti) and U.S. Pat. No. 6,458,722 (issued to Kapoor).

However, in the formation of the silicon-rich oxide layer using the LPCVD process, bonds of silicon-oxygen (Si—O) may be generated more than bonds of silicon-silicon (Si—Si) in numbers after the silane $(SiH_4)$ gas and the nitrous oxide $(N_2O)$ gas are chemically reacted with each other. Thus, there is a limit to increase a silicon content of the silicon-rich oxide layer.

Meanwhile, in the formation of the silicon-rich oxide layer on a semiconductor substrate having a pattern thereon through the PECVD process, the silicon-rich oxide layer may have a poor step coverage due to a plasma employed in the PECVD process. Further, portions of the silicon-rich oxide layer on a sidewall of the pattern and a bottom of the pattern may have silicon contents different from those of other portions of the silicon-rich oxide layer.

In the formation of the silicon-rich oxide layer by the silicon implantation process in which silicon atoms are injected into an oxide layer, a leakage current may be generated because of damages to the silicon-rich oxide layer caused by the injection of the silicon atoms. Further, it is very difficult to control densities and sizes of the silicon nanocrystals in the silicon-rich oxide layer.

SUMMARY OF THE INVENTION

Example embodiments of the present invention provide a method of forming a silicon-rich nanocrystalline structure having a good step coverage and an improved variation of silicon content therein by an atomic layer deposition process.

Example embodiments of the present invention provide a method of manufacturing a non-volatile semiconductor device including the silicon-rich nanocrystalline structure as a charge trapping layer.

According to one aspect of the present invention, there is provided a method of forming a silicon-rich nanocrystalline structure by an atomic layer deposition (ALD) process. In the method of forming the silicon-rich nanocrystalline structure, a first gas including a first silicon compound is provided onto an object to form a silicon-rich chemisorption layer on the object. A second gas including oxygen is provided onto the silicon-rich chemisorption layer to form a silicon-rich insulation layer on the object. A third gas including a second silicon compound is provided onto the silicon-rich insulation layer to form a silicon nanocrystalline layer on the silicon-rich insulation layer.

In some example embodiments of the present invention, the first silicon compound may include two silicon atoms.

In an example embodiment of the present invention, the first silicon compound may include hexachlorodisilane (HCD).

In some example embodiments of the present invention, the second gas may include a nitrous oxide ($N_2O$) gas or an oxygen ($O_2$) gas.

In some example embodiments of the present invention, the second silicon compound may include silicon and hydrogen.

In an example embodiment of the present invention, the second silicon compound may include silane ($SiH_4$).

In an example embodiment of the present invention, providing the first gas and providing the second gas may be repeated to adjust a silicon content of the silicon-rich insulation layer before providing the third gas.

In an example embodiment of the present invention, the sizes of silicon nanocrystals and the density of the silicon nanocrystals in the silicon nanocrystalline layer may be adjusted by a flow rate of the third gas.

In an example embodiment of the present invention, providing the first gas, providing the second gas and providing the third gas may be repeated to alternately form a plurality of silicon-rich insulation layers and a plurality of silicon nanocrystalline layers on the object.

In an example embodiment of the present invention, undesired materials may be removed from the silicon-rich insulation layer before providing the third gas. The undesired materials may be removed by providing a hydrogen containing gas onto the silicon-rich insulation layer. The hydrogen containing gas may include an ammonia ($NH_3$) gas, a hydrogen ($H_2$) gas and/or a deuterium ($D_2$) gas.

In an example embodiment of the present invention, the silicon-rich nanocrystalline structure may be thermally treated. The silicon-rich nanocrystalline structure may be thermally treated at a temperature of about 800 to about 1,100° C. for about 10 to about 90 minutes under an atmosphere including nitrogen.

In an example embodiment of the present invention, the silicon-rich nanocrystalline structure may be preliminarily oxidized. The silicon-rich nanocrystalline structure may be preliminarily oxidized under an atmosphere including nitrogen and oxygen.

In an example embodiment of the present invention, the silicon-rich nanocrystalline structure may be flash annealed. The silicon-rich nanocrystalline structure may be flash annealed at a temperature of about 20 to about 500° C. for about 5 to about 20 microseconds.

According to another aspect of the present invention, there is provided a method of manufacturing a non-volatile semiconductor device. In the method of manufacturing the non-volatile semiconductor device, a tunnel dielectric layer is formed on a semiconductor substrate. A charge trapping structure is formed on the tunnel dielectric layer by an ALD process. A control gate is formed on the charge trapping structure. The charge trapping structure is formed through providing a first gas comprising a first silicon compound onto the tunnel dielectric layer to form a silicon-rich chemisorption layer on the tunnel dielectric layer, providing a second gas comprising oxygen onto the silicon-rich chemisorption layer to form a silicon-rich insulation layer on the tunnel dielectric layer, and providing a third gas comprising a second silicon compound onto the silicon-rich insulation layer to form a silicon nanocrystalline layer on the silicon-rich insulation layer.

In some example embodiments of the present invention, the first silicon compound may differ from the second silicon compound.

In some example embodiments of the present invention, the first silicon compound may include two silicon atoms.

In some example embodiments of the present invention, the second silicon compound may include one silicon atom and hydrogen.

In an example embodiment of the present invention, the first silicon compound may include HCD, and the second silicon compound may include silane.

In an example embodiment of the present invention, the second gas may include an $N_2O$ gas or an $O_2$ gas.

In some example embodiments of the present invention, providing the first gas and providing the second gas may be repeated at least once to adjust a silicon content of the silicon-rich insulation layer before providing the third gas.

In some example embodiments of the present invention, the sizes of silicon nanocrystals and the density of the silicon nanocrystals in the silicon nanocrystalline layer may be adjusted by a flow rate of the third gas.

In some example embodiments of the present invention, providing the first gas, providing the second gas and providing the third gas may be repeated to alternately form the charge trapping structure including a plurality of silicon-rich insulation layers and a plurality of silicon nanocrystalline layers on the tunnel dielectric layer.

In an example embodiment of the present invention, undesired materials may be removed from the silicon-rich insulation layer before providing the third gas. The undesired materials may be removed by providing a hydrogen containing gas onto the silicon-rich insulation layer.

In some example embodiments of the present invention, the hydrogen containing gas may include an $NH_3$ gas, an $H_2$ gas and/or a $D_2$ gas.

In an example embodiment of the present invention, the charge trapping structure may be thermally treated under an atmosphere including nitrogen.

In an example embodiment of the present invention, the charge trapping structure may be preliminarily oxidized under an atmosphere including nitrogen and oxygen.

In an example embodiment of the present invention, the charge trapping structure may be flash annealed for about 5 to about 20 microseconds.

In an example embodiment of the present invention, a blocking dielectric layer may be formed on the charge trapping structure before forming the control gate. The blocking dielectric layer may be formed using a silicon compound or a metal oxide.

According to the present invention, a silicon-rich nanocrystalline structure may include at least one silicon-rich insulation layer and at least one silicon nanocrystalline layer alternately formed on an object or a substrate or a tunnel dielectric layer. The at least one silicon-rich insulation layer and the at least one silicon nanocrystalline layer may be formed by atomic layer deposition processes using first gases capable of widening a silicon content in a wide range. In addition, the silicon-rich nanocrystalline structure may have a high silicon content and a good step coverage. When the silicon-rich nanocrystalline structure is employed as a charge trapping structure of a non-volatile semiconductor device, the non-volatile semiconductor device may have improved programming and erasing operations and also an enhanced data retention capability.

BRIEF DESCRIPTION OF THE DRAWINGS

The above and other features and advantages of the present invention will become readily apparent by reference to the following detailed description when considered in conjunction with the accompanying drawings wherein.

DESCRIPTION OF THE EMBODIMENTS

Figure 1:
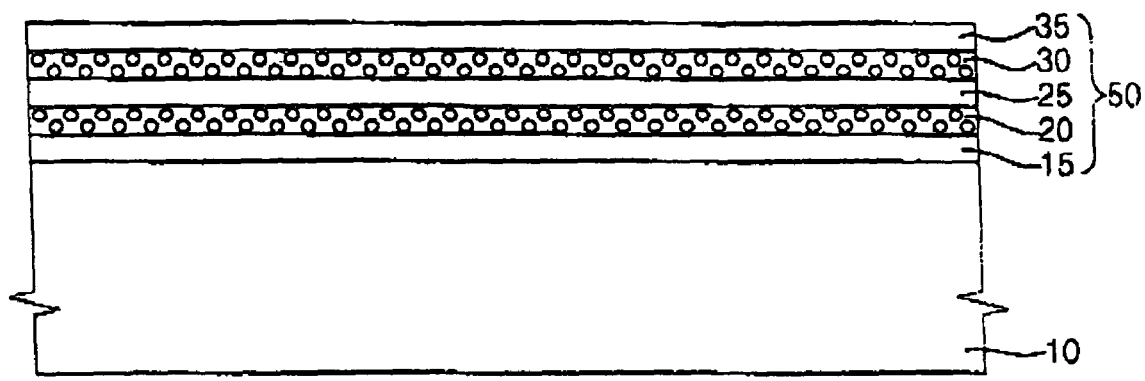
FIG. 1 is a cross-sectional view illustrating a silicon-rich nanocrystalline structure in accordance with example embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Silicon-Rich Nanocrystalline Structure

FIG. 1 is a cross-sectional view illustrating a silicon-rich nanocrystalline structure in accordance with example embodiments of the present invention.

Referring to FIG. 1, a silicon-rich nanocrystalline structure 50 according to some embodiments of the present invention includes a plurality of silicon-rich insulation layers 15, 25 and 35 and a plurality of silicon nanocrystalline layers 20 and 30 alternately stacked on an object 10.

The object 10 may include a semiconductor substrate such as a silicon wafer or a silicon-on-insulator (SOI) substrate. Alternatively, the object 10 may include a single crystalline metal oxide substrate.

In some example embodiments of the present invention, a conductive layer and/or an insulation layer may be interposed between the object 10 and the silicon-rich nanocrystalline structure 50.

In one example embodiment of the present invention, the silicon-rich insulation layers 15, 25 and 35 may correspond to silicon-rich silicon oxide layers, and the silicon nanocrystalline layers 20 and 30 may correspond to nanocrystalline silicon oxide layers, respectively. In another example embodiment of the present invention, the silicon-rich insulation layers 15, 25 and 35 may correspond to silicon-rich silicon oxynitride layers, and the silicon nanocrystalline layers 20 and 30 may correspond to nanocrystalline silicon oxynitride layers.

In some example embodiments of the present invention, each of the silicon-rich insulation layers 15, 25 and 35 may be formed on the object 10 by an ALD process using a first gas and a second gas. The first gas may include a first silicon compound having two silicon atoms and the second gas may include oxygen (O). For example, the first silicon compound may include hexachlorodisilane (HCD; $Si_2Cl_6$) and the second gas may include a nitrous oxide ($N_2O$) gas or an oxygen ($O_2$) gas. Here, each of the silicon-rich insulation layers 15, 25 and 35 may correspond to the silicon-rich silicon oxide layer.

In some example embodiments of the present invention, each of the silicon nanocrystalline layers 20 and 30 may be formed by an ALD process using a third gas including a second silicon compound. For example, the second silicon compound may include silane ($SiH_4$). Here, each of the silicon nanocrystalline layers 20 and 30 may correspond to the nanocrystalline silicon oxide layer. In addition, each of the silicon-rich insulation layers 15, 25 and 35 may be formed by an ALD process using a first gas, a second gas and a third gas. The first gas may include a first silicon compound and the second gas may include oxygen. Additionally, the third gas may include hydrogen (H). For example, the first silicon compound may include HCD, and the second gas may include a nitrous oxide gas or an oxygen gas. Further, the third gas may include an ammonia ($NH_3$) gas, a hydrogen ($H_2$) gas and/or a deuterium ($D_2$) gas. Here, each of the silicon-rich insulation layers 15, 25 and 35 may correspond to the silicon-rich silicon oxynitride layer. Additionally, each of the silicon nanocrystalline layers 20 and 30 may be formed by an ALD process using a fourth gas including a second silicon compound. For example, the second silicon compound may include silane. Here, each of the silicon nanocrystalline layers 20 and 30 may correspond to the nanocrystalline silicon oxynitride layer.

In an ALD process, a mono-layer of reactive precursors may be formed on an object such as a substrate by chemisorbing the reactive precursors onto the object. That is, the reactive precursors for forming the mono-layer may be alternately introduced into a reaction chamber in which the object is loaded by separating the introductions of the reactive precursors using purges of inactive gases. Each of the introductions of the reactive precursors may allow a mono-layer to be formed on a previously formed mono-layer, thereby forming a uniform thin layer on the object. The cycles of the ALD process may be repeated to provide the uniform thin layer with a desired thickness.

In a conventional ALD process for forming a silicon oxide layer using a silicon compound such as silane that includes one silicon atom, the silicon oxide layer may have a content ratio between silicon and oxygen of about 1.0:1.95. In the above-described ALD process according to some example embodiments of the present invention, the silicon-rich silicon oxide layer may have a relatively high content ratio between silicon and oxygen of about 1.0:1.8 because the silicon-rich silicon oxide layer may be formed using the first silicon compound that includes two silicon atoms such as HCD. Therefore, each of the silicon-rich insulation layers 15, 25 and 35 may have a silicon content substantially higher than that of the convention silicon oxide layer.

Figure 2:
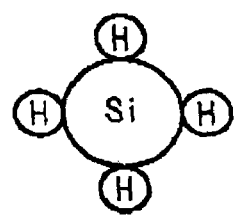
FIG. 2 is a schematic plan view illustrating a chemical structure of silane ($SiH_4$)
Figure 3:
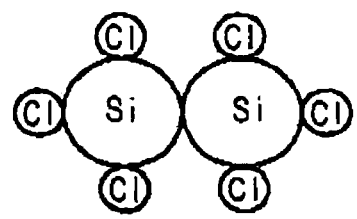
FIG. 3 is a schematic plan view illustrating a chemical structure of hexachlorodisilane ($Si_2Cl_6$)

FIG. 2 is a schematic plan view illustrating a chemical structure of silane ($SiH_4$) and FIG. 3 is a schematic plan view illustrating a chemical structure of HCD ($Si_2Cl_6$).

As shown in FIGS. 2 and 3, a group of —$SiH_3$ may be chemisorbed on a surface of a substrate when an ALD process may be performed using a silane ($SiH_4$) gas. When an ALD process is executed using an HCD gas, however, a group of —$Si_2Cl_4$ or —$Si_2Cl_5$ may be chemisorbed on a surface of a substrate. Particularly, when the silane gas is used in the ALD process, a silicon compound including one silicon atom may be chemisorbed on the surface of the substrate. On the contrary, when the HCD gas is used in the ALD process, a silicon compound including two silicon atoms may be chemisorbed on the surface of the substrate so that a silicon content in a chemisorption layer formed using the HCD gas may increase, thereby obtaining a silicon-rich chemisorption layer on the substrate.

In some example embodiments of the present invention, a silicon-rich chemisorption layer having a high silicon content may be formed on an object when the silicon-rich chemisorption layer is formed using a first gas including the first silicon compound having two silicon atoms such as HCD. When a second gas including oxygen is provided onto the silicon-rich chemisorption layer, a single silicon-rich silicon oxide layer may be formed on the object in accordance with a reaction between the second gas and the silicon-rich chemisorption layer.

In some example embodiments of the present invention, a second gas including oxygen and a third gas including hydrogen may be provided onto the silicon-rich chemisorption layer formed on the object. Thus, a single silicon-rich silicon oxynitride layer may be formed on the object and undesired materials such as chlorine (Cl) may be simultaneously removed from the single silicon-rich silicon oxynitride layer.

In the conventional ALD process using the silane gas, adjacent silicon atoms may be indirectly bonded with each other via an oxygen atom therebetween in a single silicon oxide layer. However, according to the above-described ALD process of the present invention, adjacent silicon atoms may be directly bonded with each other in a single silicon-rich insulation layer to thereby generate bonds of silicon-silicon (Si—Si) in the single silicon-rich insulation layer when the single silicon-rich insulation layer is formed using the first gas including HCD and the second gas including oxygen or additionally using the third gas including hydrogen. Thus, the silicon-rich insulation layer formed using HCD may have a silicon content substantially higher than that of the conventional silicon oxide layer formed using silane. As a result, the silicon-rich insulation layers 15, 25 and 35 may have high silicon contents when the silicon-rich insulation layers 15, 25 and 35 are formed using the first gases including HCD.

In some example embodiments of the present invention, the cycles of providing the first gas and providing the second gas may be repeatedly performed to form the silicon-rich insulation layer having a desired thickness and a desired silicon content on an object. Alternatively, the cycles of providing the first gas, providing the second gas and providing the third gas may be repeatedly carried out so as to form the desired silicon-rich insulation layer on the object.

Referring now to FIG. 1, each of the silicon nanocrystalline layers 20 and 30 may be formed by the ALD process using the third gas including the second silicon compound.

In an example embodiment of the present invention, one cycle of the ALD process may be executed to form one silicon-rich insulation layer 15 on the object 10, and then another cycle of the ALD process may be performed using a gas including the second silicon compound to thereby change a portion of the silicon-rich insulation layer 15 into one silicon nanocrystalline layer 20. Thus, the silicon nanocrystalline layer 20 may be formed on the silicon-rich insulation layer 15. When a gas including the second silicon compound and hydrogen may be provided onto the silicon-rich insulation layer 15, one silicon nanocrystalline layer 20 may be formed on one silicon-rich insulation layer 15 in accordance with a reaction between the second silicon compound and the silicon-rich insulation layer 15. Simultaneously, undesired materials including chlorine may be removed from the silicon-rich insulation layer 15.

Using the above-described cycles of the ALD process, another silicon-rich insulation layer 25 may be formed on the silicon nanocrystalline layer 20, and then a portion of the silicon-rich insulation layer 25 may be changed into another silicon nanocrystalline layer 30. Those cycles of the ALD process may be repeatedly carried out to thereby obtain the silicon-rich nanocrystalline structure 50 including the plurality of silicon-rich insulation layers 15, 25 and 35 and the plurality of silicon nanocrystalline layers 20 and 30 on the object 10.

In some example embodiments of the present invention, the silicon-rich nanocrystalline structure 50 may have a high silicon content because the silicon nanocrystalline layers 20 and 30 are interposed between the silicon-rich insulation layers 15, 25 and 25 having high silicon contents, respectively.

In some example embodiments of the present invention, each of the silicon-rich insulation layers 15, 25 and 35 may have a desire thickness and a desired silicon content by adjusting the cycles of the ALD process. Further, sizes and densities of silicon nanocrystals in the silicon nanocrystalline layers 20 and 30 may be controlled by adjusting the cycles of the ALD process. Therefore, the silicon content in the silicon-rich nanocrystalline structure 50 may be varied in a wide range, and also the silicon-rich nanocrystalline structure 50 may have an improved thickness uniformity and a good step coverage.

Method of Forming a Silicon-Rich Nanocrystalline Structure

Figure 4:
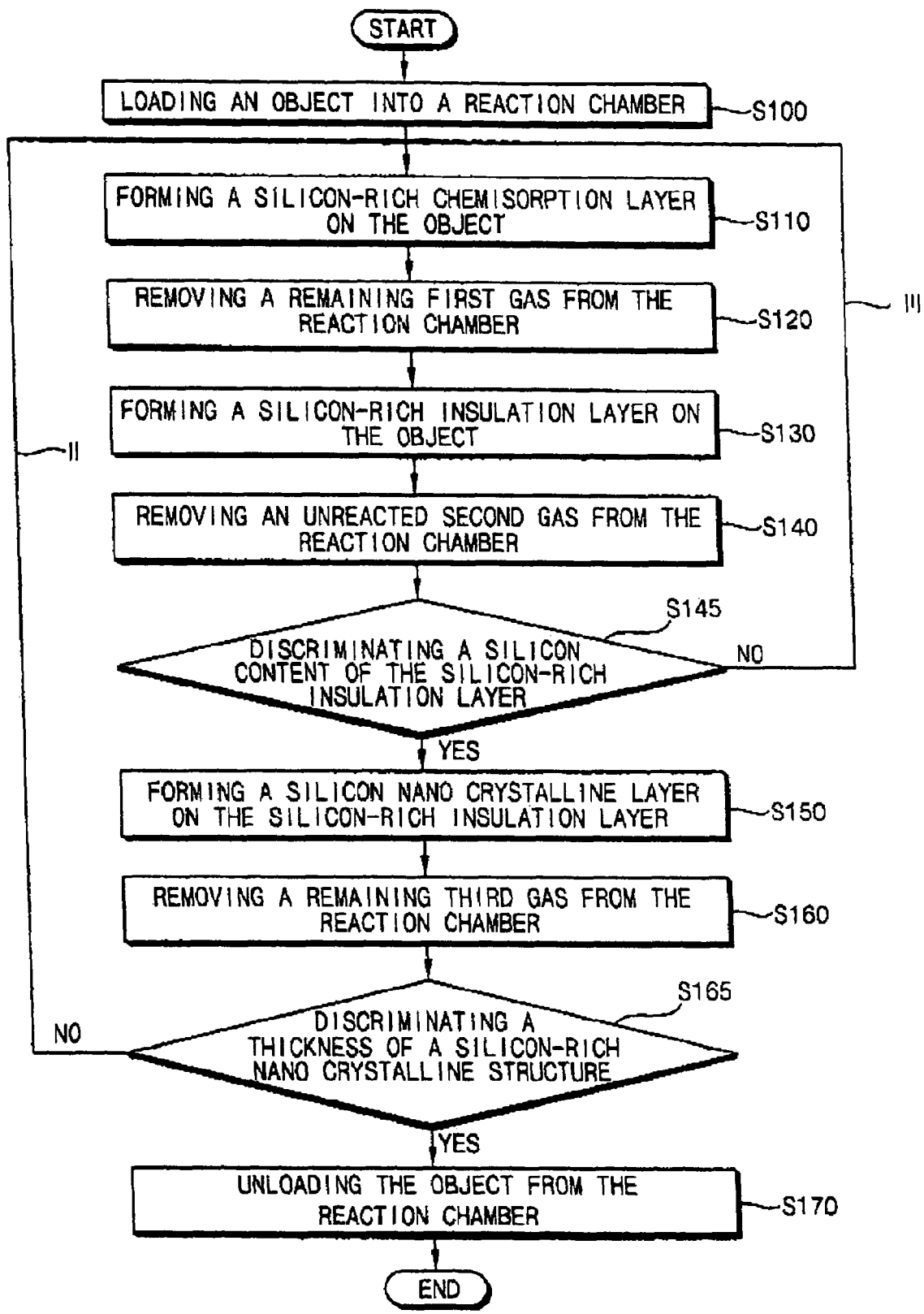
FIG. 4 is a flow chart illustrating a method of forming a silicon-rich nanocrystalline structure by an ALD process in accordance with example embodiments of the present invention.

FIG. 4 is a flow chart illustrating a method of forming a silicon-rich nanocrystalline structure by an ALD process in accordance with example embodiments of the present invention.

Referring to FIG. 4, an object such as a semiconductor substrate or a single crystalline metal oxide substrate is loaded into a reaction chamber of an ALD apparatus in step S100. The reaction chamber may have a temperature of about 600 to about 650° C. For example, the reaction chamber may have a temperature of about 630° C. Thus, the object loaded in the reaction chamber may substantially have the temperature of about 600 to about 650° C.

In step S110, a first gas including a first reactive precursor is provided onto the object loaded in the reaction chamber to form a silicon-rich chemisorption layer on the object. The first gas may include a first silicon compound containing at least two silicon atoms. For example, the first gas may include HCD as the first reactive precursor.

While the first gas including HCD is provided onto the object, a first portion of the first gas may be chemisorbed on the object to form the silicon-rich chemisorption layer on the object. However, a second portion of the first gas may be physisorbed on the object or the silicon-rich chemisorption layer. Additionally, the second portion of the first gas may drift in the reaction chamber. The physisorbed or drifted second portion of the first gas may serve as impurities or contaminants that may reduce a purity of the silicon-rich chemisorption layer.

In step S120, the second portion of the first gas remaining in the reaction chamber is removed from the reaction chamber, the silicon-rich chemisorption layer and the object. In one example embodiment of the present invention, a remaining first gas may be removed by a first pumping process. For example, the first pumping process may be carried out until the reaction chamber has an internal pressure below about 1.0 Torr. In another example embodiment of the present invention, the second portion of the first gas may be removed by a first purge process using a first purge gas. The first purge gas may include an inactive gas such as an argon (Ar) gas, a helium (He) gas, a nitrogen ($N_2$) gas, etc. In still another example embodiment of the present invention, the first gas remaining in the reaction chamber may be removed from the reaction chamber by simultaneously performing the first pumping process and the first purge process.

In step S130, a second gas including a second reactive precursor is provided onto the silicon-rich chemisorption layer to form a silicon-rich insulation layer on the object. The second gas may include oxygen as the second reactive precursor. For example, the second gas may include a nitrous oxide gas or an oxygen gas. When the second gas includes oxygen, the silicon-rich insulation layer may correspond to a silicon-rich silicon oxide layer.

When the second gas including oxygen is provided onto the silicon-rich chemisorption layer, oxygen in the second gas reacts with the silicon-rich chemisorption layer so that a single silicon-rich insulation layer is formed on the object. Here, the silicon-rich insulation layer may have a high silicon content and a good step coverage.

In step S140, an unreacted second gas remaining in the reaction chamber is removed from the reaction chamber after the formation of the silicon-rich insulation layer. In one example embodiment of the present invention, the unreacted second gas may be removed from the reaction chamber by a second pumping process. For example, the second pumping process may be executed until the reaction chamber has an internal pressure below about 1.0 Torr. In another example embodiment of the present invention, the remaining second gas may be removed by a second purge process using a second purge gas. The second purge gas may include an inactive gas such as an argon gas, a helium gas, a nitrogen gas, etc. In still another example embodiment of the present invention, the unreacted second gas remaining in the reaction chamber may be removed by simultaneously performing the second pumping process and the second purge process.

Referring now to FIG. 4, after discriminating a silicon content in the silicon-rich insulation layer in step S145, a first cycle (I) of the ALD process may be repeated at least once until the silicon-rich insulation layer has a desired silicon content when the silicon-rich insulation layer has an insufficient silicon content. The first cycle (I) includes providing the first gas (step S110), removing the remaining first gas (step S120), providing the second gas (step S130) and removing the unreacted second gas (step S140). That is, the first cycle (I) may be advantageously carried out so as to adjust the silicon content or a silicon richness of the silicon-rich insulation layer.

When the first cycle (I) may be insufficiently repeated, the silicon content in silicon-rich insulation layer may be excessively increased such that the silicon-rich insulation layer may not be properly served as an insulation layer. Hence, the number of the first cycle (I) may be adjusted to control the silicon content in the silicon-rich insulation layer. For example, the first cycle (I) may be five times to ten times repeatedly carried out to form the silicon-rich insulation layer having a proper silicon content.

After repeatedly performing the first cycle (I) of the ALD process, a third gas including a third reactive precursor is provided onto the silicon-rich insulation layer to form silicon nanocrystalline layer on the silicon-rich insulation layer in step S150. The third gas may include a second silicon compound as the third reactive precursor. The second silicon compound may include silicon and hydrogen. For example, the second silicon compound may include silane. When the third gas is provided onto the silicon-rich insulation layer, a portion of the silicon-rich insulation layer is changed into the silicon nanocrystalline layer in accordance with a reaction between the third gas and the silicon-rich insulation layer. Additionally, the third gas may remove undesired material such as chlorine (Cl) from the silicon-rich insulation layer. When the silicon-rich insulation layer corresponds to the silicon-rich oxide layer, the silicon nanocrystalline layer corresponds to a nanocrystalline silicon oxide layer.

When the silicon-rich insulation layer is formed using the first reactive precursor including HCD and the second reactive precursor including oxygen, the thickness of the silicon-rich insulation layer on the object may not increase any more at a certain point of time although the first cycle (I) of the ALD process is repeated. This is caused by chlorine (Cl) in HCD covalently bonded with the silicon in the silicon-rich insulation layer so that chlorine may interfere with chemical bonding between silicon and silicon or silicon and oxygen.

When the silicon-rich insulation layer does not have a desired thickness, an interval between a lower silicon nanocrystalline layer and an upper silicon nanocrystalline layer formed over the lower silicon nanocrystalline layer may be decreased. When a silicon-rich nanocrystalline structure including those silicon nanocrystalline layers is used as a charge trapping structure of a non-volatile semiconductor memory device, undesired force such as attractive force or repulsive force may be generated among electrons trapped in adjacent silicon nanocrystalline layers, thereby deteriorating electrical characteristics of the non-volatile semiconductor device. To prevent such a problem, after forming the silicon-rich insulation layer that has a unit of an atomic layer by using the first reactive precursor including HCD and the second reactive precursor including oxygen, chlorine in the; silicon-rich insulation layer may be removed by providing a hydrogen containing gas onto the silicon-rich insulation layer.

When a silicon-rich oxide layer having a thickness of about 106 Å may be formed on an object by about 80 times repeating a first cycle (I) of an ALD process that includes providing an HCD gas, removing a remaining HCD gas, providing a nitrous oxide gas and removing an unreacted nitrous oxide gas. However, the silicon-rich oxide layer may have a refractive index of about 1.77 so that the silicon-rich oxide layer may have a relatively low silicon content.

In some example embodiments of the present invention, after the first cycle (I) of the ALD process may be repeatedly performed, the third gas including silicon and hydrogen may be provided onto the silicon-rich insulation layer thereby to form the silicon nanocrystalline layer and to simultaneously remove undesired material such as chlorine from the silicon-rich insulation layer. Therefore, the silicon-rich insulation layer may be continuously grown on the object and the silicon content of the silicon-rich insulation layer may be advantageously adjusted.

When the third gas including silane is introduced into the reaction chamber having a pressure of about 1.0 Torr by a flow rate of about 0.5 liter/sec for about 8 seconds, silane in the third gas reaching on the silicon-rich insulation layer may be decomposed into silicon (Si) and hydrogen (H) due to a temperature of the object so that silicon may form the silicon nanocrystalline layer on the silicon-rich insulation layer. Simultaneously, hydrogen may react with chlorine to form hydrogen chloride (HCl) so that chlorine may be removed from the silicon-rich insulation layer. Here, sizes and densities of silicon nanocrystals in the silicon nanocrystalline layers may be controlled in accordance with the flow rate of the third gas including silane.

After forming the silicon nanocrystalline layer and removing the undesired materials such as chlorine from the silicon-rich insulation layer, a remaining third gas is removed from the reaction chamber in step S160. In one example embodiment of the present invention, the third gas remaining in the reaction chamber may be removed by a third pumping process performed until the reaction chamber has an internal pressure of about 1.0 Torr. In another example embodiment of the present invention, the remaining third gas may be removed from the reaction chamber by a third purge process using a third purge gas that includes an inactive gas such as an argon gas, a helium gas, a nitrogen gas, etc. In still another example embodiment of the present invention, the remaining third gas may be removed by simultaneously executing the third pumping process and the third purge process.

When the silicon nanocrystalline layer is formed on the silicon-rich insulation layer, the silicon-rich nanocrystalline structure is formed on the object.

Referring now to FIG. 4, after discriminating a thickness of the silicon-rich nanocrystalline structure in step S145, a second cycle (II) of the ALD process is repeated until the silicon-rich nanocrystalline structure has a desired thickness. The second cycle (II) includes providing the first gas (step S110), removing the remaining first gas (step S120), providing the second gas (step S130), removing the unreacted second gas (step S140), providing the third gas (step S150) and removing the remaining third gas (step S160). As a result, the silicon-rich nanocrystalline structure having the desired thickness may be formed on the object. When the second cycle (II) is repeatedly carried out, the silicon-rich nanocrystalline structure includes a plurality of silicon-rich insulation layers and a plurality of silicon nanocrystalline layers alternately formed on the object.

In step S170, the object having the silicon-rich nanocrystalline structure is unloaded from the reaction chamber after repeating the second cycle (II) of the ALD process.

In an example embodiment of the present invention, the silicon-rich nanocrystalline structure may be thermally treated so as to increase an amount of silicon nanocrystals in the silicon nanocrystalline layers and in order to cure undesired trap sites in the silicon-rich insulation layers. For example, the silicon-rich nanocrystalline structure may be thermally treated at a temperature of about 800 to about 1,000° C. for about 10 to about 90 minutes under an atmosphere including nitrogen. When the thermally treated silicon-rich nanocrystalline structure is employed as a charge trapping structure of a non-volatile semiconductor device, the non-volatile semiconductor device may have improved programming and erasing operations. For example, the non-volatile semiconductor device including the thermally treated silicon-rich nanocrystalline structure as the charge trapping structure may have programming and erasing operations about 1.5 to about 2.0 faster than those of the conventional non-volatile semiconductor device.

In an example embodiment of the present invention, the silicon-rich nanocrystalline structure may be preliminarily oxidized under an atmosphere including nitrogen and oxygen so as to prevent the silicon-rich nanocrystalline structure from excessively being oxidized in subsequent processes. Thus, the non-volatile semiconductor device including the preliminarily oxidized silicon-rich nanocrystalline structure as the charge trapping structure may have an enhanced data retention capability.

In an example embodiment of the present invention, the silicon-rich nanocrystalline structure may be flash annealed to increase the amount of silicon nanocrystals in the silicon nanocrystalline layers. For example, the silicon-rich nanocrystalline structure may be flash annealed at a temperature of about 20 to about 500° C. for about 5 to about 20 microseconds. When the non-volatile semiconductor device includes the flash annealed silicon-rich nanocrystalline structure as the charge trapping structure, the non-volatile semiconductor device may have improved programming and erasing operations and an enhanced data retention capability. For example, the non-volatile semiconductor device including the flash annealed silicon-rich nanocrystalline structure as the charge trapping structure may have the programming and erasing operations about 10 to about 20 percent faster than those of the conventional non-volatile semiconductor device.

In some example embodiments of the present invention, the silicon-rich insulation layer may be formed on the object by properly repeating the first cycle (I) including providing the first gas (step S110), removing the remaining first gas (step S120), providing the second gas (step S130) and removing the remaining second gas (step S140). Then, after performing providing the third gas (step S150) and removing the remaining third gas (step S160), the silicon-rich nanocrystalline structure may be formed on the object by pertinently repeating the second cycle (II) including providing the first gas (step S110), removing the remaining first gas (step S120), providing the second gas (step S130), removing the remaining second gas (step S140), providing the third gas (step S150) and removing the remaining third gas (step S160). Since the silicon nanocrystalline layers may be formed on the silicon-rich insulation layers having desired silicon contents and the undesired materials may be advantageously removed from the silicon-rich insulation layers, the silicon-rich nanocrystalline structure may have an improved silicon content and a desired uniform thickness.

Table 1 shows thicknesses and refractive indexes of the silicon-rich nanocrystalline structures relative to the numbers of the first cycle (I) and the second cycle (II) in accordance with example embodiments of the present invention.

TABLE 1

| The number of first cycle (I) | The number of second cycle (II) | Thickness (Å) | Refractive index |
|---|---|---|---|
| 3 | 10 | 74 | 2.14 |
| 5 | 10 | 80 | 2.13 |
| 10 | 10 | 83 | 2.09 |
| 15 | 10 | 91 | 2.11 |

As shown in Table 1, each of the silicon-rich nanocrystalline structures of the present invention has a refractive index above about 2.0. Thus, the silicon-rich nanocrystalline structures of the present invention may have high silicon contents (that is, high silicon richness), respectively.

After the silicon-rich insulation layer is formed by repeating the first cycle (I), the third gas including silane is applied to the silicon-rich insulation layer to form the silicon nanocrystalline layer and to simultaneously remove chlorine from the silicon-rich insulation layer. However, there is a limit to increase the thickness of the silicon-rich insulation layer. For example, when the first cycle (I) is repeated more than about 10 times, the thickness of the silicon-rich insulation layer may not increase any more. This means that chlorine may not be sufficiently removed from the silicon-rich insulation layer using only the third gas including silane. Therefore, an additional gas for removing chlorine besides silane may be demanded so as to increase the thickness variation range of the silicon-rich insulation layer.

Figure 5:
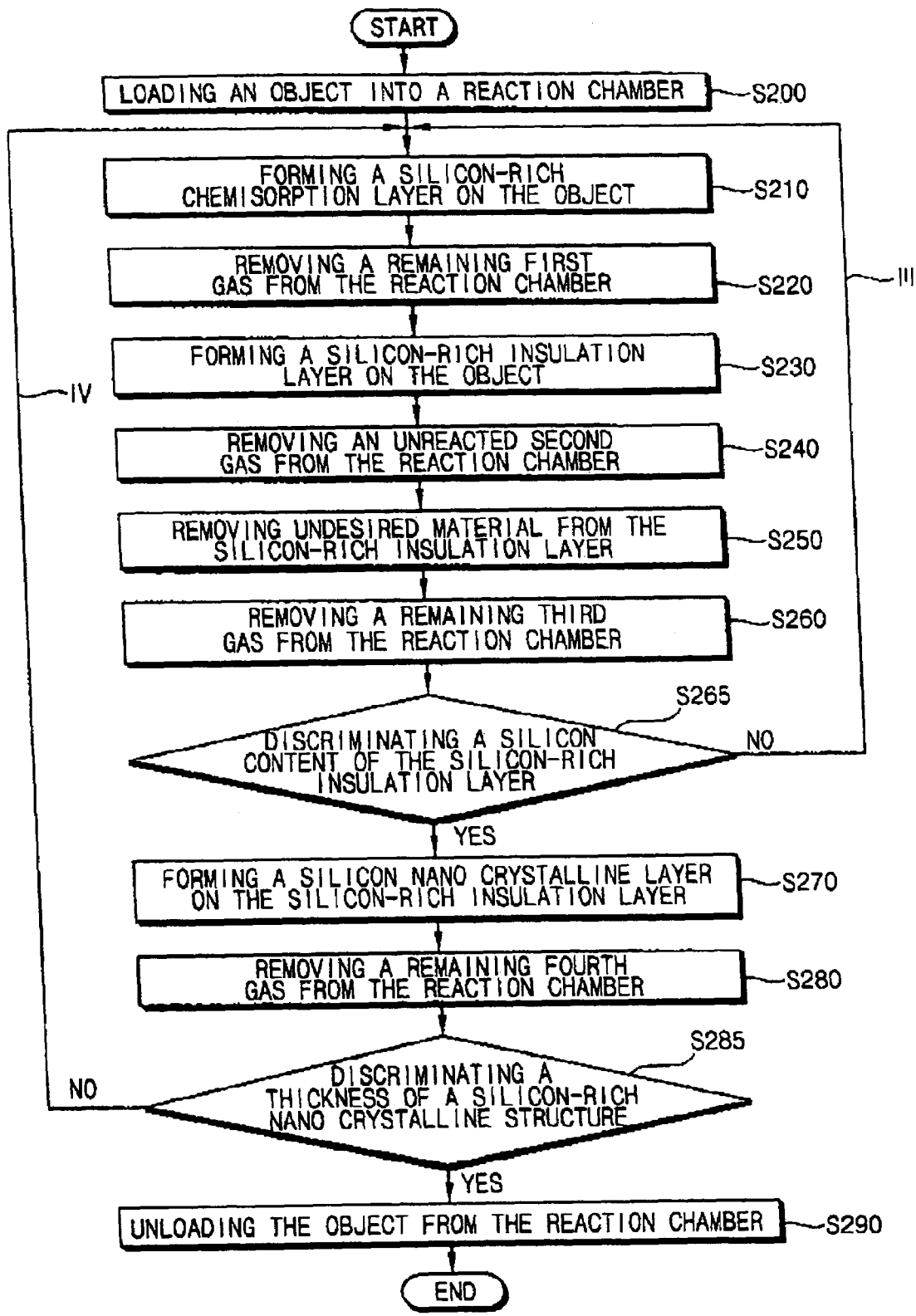
FIG. 5 is a flow chart illustrating a method of forming a silicon-rich nanocrystalline structure by an ALD process in accordance with example embodiments of the present invention.

FIG. 5 is a flow chart illustrating a method of forming a silicon-rich nanocrystalline structure by an ALD process in accordance with example embodiments of the present invention.

Referring to FIG. 4, an object such as a semiconductor substrate or a single crystalline metal oxide substrate is loaded into a reaction chamber of an ALD apparatus in step S200. The reaction temperature may have an internal temperature of about 600 to about 630° C.

In step S210, a first gas including a first reactive precursor is provided onto the object to form a silicon-rich chemisorption layer on the object. The first gas may include a first silicon compound containing at least two silicon atoms as the first reactive precursor. For example, the first gas may include HCD. When the first gas is introduced into the chamber, a first portion of the first gas is chemisorbed on the object to form the silicon-rich chemisorption layer whereas a second portion of the first gas is drifted in the reaction chamber or the second portion of the first gas is physisorbed to the object or the silicon-rich chemisorption layer.

In step S220, a remaining first gas in the reaction chamber is removed from the reaction chamber. The second portion of the first gas remaining in the reaction chamber may be removed by a first pumping process, a first purge process or a combination process of first pumping and first purge. For example, the first pumping process may be carried out until the reaction chamber has an internal pressure of about 1.0 Torr or the first purge process may be performed using a first purge gas including an argon gas, a helium gas or a nitrogen gas.

In step S230, a second gas including a second reactive precursor is provided onto the silicon-rich chemisorption layer to form a silicon-rich insulation layer on the object. The second gas may include a nitrous oxide gas or an oxygen gas as the second reactive precursor. The silicon-rich insulation layer is formed on the object in accordance with a reaction between the second gas and the silicon-rich chemisorption layer. Thus, the silicon-rich insulation layer may have a high silicon content and good step coverage.

In step S240, an unreacted second gas remaining in the reaction chamber is removed from the reaction chamber. The remaining second gas in the reaction chamber may be removed by a second pumping process, a second purge process or a combination process of second pumping and second purge. For example, the second pumping process may be carried out until the reaction chamber has an internal pressure of about 1.0 Torr or the second purge process may be performed using a second purge gas including an argon gas, a helium gas or a nitrogen gas.

In step S250, a third gas having a reactivity relative to undesired materials in the silicon-rich insulation layer is provided onto the silicon-rich insulation layer to remove the undesired materials from the silicon-rich insulation layer. The third gas may include hydrogen. For example, the third gas may include an ammonia gas ($NH_3$) gas, a hydrogen ($H_2$) gas, a deuterium ($D_2$) gas, etc. Hydrogen in the third gas may react with chlorine in the silicon-rich insulation layer to form hydrogen chloride such that the undesired materials such as chloride may be removed from the silicon-rich insulation layer.

When the third gas includes hydrogen and nitrogen such as the ammonia gas and the silicon-rich insulation layer corresponds to a silicon-rich oxide layer, nitrogen in the third gas may react with silicon in the silicon-rich insulation layer to thereby form bonds of silicon-nitrogen (Si—N) having high bonding strength while reducing dangling bonds of silicon. As a result, the silicon-rich insulation layer may be converted into a silicon-rich oxynitride layer. The bonds of silicon-nitrogen the silicon-rich oxynitride layer may reduce undesired trap sites formed in the silicon-rich oxynitride layer and to improve heat-resistant and stress-resistant characteristics of the silicon-rich oxynitride layer.

After the formation of the silicon-rich insulation layer, a remaining third gas in the reaction chamber is removed from the reaction chamber in step S260. As described above, the remaining third gas in the reaction chamber may be removed by a third pumping process, a third purge process or a combination process of third pumping and third purge. For example, the third pumping process may be carried out until the reaction chamber has an internal pressure of about 1.0 Torr or the third purge process may be performed using a third purge gas including an argon gas, a helium gas or a nitrogen gas.

After discriminating a silicon content in the silicon-rich insulation layer in step S265, a first cycle (III) of the ALD process may be repeatedly carried out at least once until the silicon-rich insulation layer has a desired silicon content. The first cycle (III) includes providing the first gas (step S210), removing the remaining first gas (step S220), providing the second gas (step S230), removing the unreacted second gas (step S240), providing the third gas (step S250) and removing the remaining third gas (step S260). The first cycle (III) may be advantageously carried out so as to adjust the silicon content or a silicon richness of the silicon-rich insulation layer.

When the first cycle (III) may be insufficiently repeated, the silicon content in silicon-rich insulation layer may be excessively increased such that the silicon-rich insulation layer may not serve as an insulation layer. Thus, the number of the first cycle (III) may be adjusted to control the silicon content in the silicon-rich insulation layer. For example, the first cycle (III) may be five times to ten times repeatedly carried out to form the silicon-rich insulation layer having the desired silicon content.

Referring now to FIG. 5, a fourth gas including a second silicon compound is provided onto the silicon-rich insulation layer to form a silicon nanocrystalline layer on the silicon-rich insulation layer in step S270. For example, the fourth gas may include silane. By adjusting a flow rate of the fourth gas, sizes and densities of silicon nanocrystals in the silicon nanocrystalline layer may be controlled.

In step S280, a remaining fourth gas is removed from the reaction chamber so that a silicon-rich nanocrystalline structure including the silicon-rich insulation layer and the silicon nanocrystalline layer is formed on the object. The remaining fourth gas in the reaction chamber may be removed by a fourth pumping process, a fourth purge process or a combination process of fourth pumping and fourth purge. For example, the fourth pumping process may be carried out until the reaction chamber has an internal pressure of about 1.0 Torr or the fourth purge process may be performed using a fourth purge gas including an argon gas, a helium gas or a nitrogen gas.

After discriminating a thickness of the silicon-rich nanocrystalline structure in step S265, a second cycle (IV) of the ALD process is repeated until the silicon-rich nanocrystalline structure has a desired thickness. The second cycle (IV) includes providing the first gas (step S210), removing the remaining first gas (step S220), providing the second gas (step S230), removing the unreacted second gas (step S240), providing the third gas (step S250), removing the remaining third gas (step S260), providing the fourth gas (step S270) and removing the remaining fourth gas (step S280). As a result, the silicon-rich nanocrystalline structure having the desired thickness may be formed on the object. When the second cycle (IV) is repeatedly performed, the silicon-rich nanocrystalline structure includes a plurality of silicon-rich insulation layers and a plurality of silicon nanocrystalline layers alternately formed on the object.

In step S290, the object having the silicon-rich nanocrystalline structure thereon is unloaded from the reaction chamber after repeating the second cycle (IV) of the ALD process.

In an example embodiment of the present invention, the silicon-rich nanocrystalline structure may be thermally treated to increase an amount of silicon nanocrystals in the silicon nanocrystalline layers and to cure undesired trap sites in the silicon-rich insulation layers. For example, the silicon-rich nanocrystalline structure may be thermally treated at a temperature of about 800 to about 1,000° C. for about 10 to about 90 minutes under an atmosphere including nitrogen. When the thermally treated silicon-rich nanocrystalline structure is employed as a charge trapping structure of a non-volatile semiconductor device, the non-volatile semiconductor device may have improved programming and erasing operations.

In an example embodiment of the present invention, the silicon-rich nanocrystalline structure may be preliminarily oxidized under an atmosphere including nitrogen and oxygen so as to prevent the silicon-rich nanocrystalline structure from excessively being oxidized in subsequent processes. Thus, the non-volatile semiconductor device including the preliminarily oxidized silicon-rich nanocrystalline structure as the charge trapping structure may have an enhanced data retention capability.

In an example embodiment of the present invention, the silicon-rich nanocrystalline structure may be flash annealed to increase the amount of silicon nanocrystals in the silicon nanocrystalline layers. For example, the silicon-rich nanocrystalline structure may be flash annealed at a temperature of about 20 to about 500° C. for about 5 to about 20 microseconds. When the non-volatile semiconductor device includes the flash annealed silicon-rich nanocrystalline structure as the charge trapping structure, the non-volatile semiconductor device may have improved programming and erasing operations and an enhanced data retention capability.

In some example embodiments of the present invention, the silicon-rich insulation layer may be formed on the object by properly repeating the first cycle (III) including providing the first gas (step S210), removing the remaining first gas (step S220), providing the second gas (step S230), removing the unreacted second gas (step S240), providing the third gas (step S250) and removing the remaining third gas (step S260). Then, after performing providing the fourth gas (step S270) and removing the remaining fourth gas (step S280), the silicon-rich nanocrystalline structure may be formed on the object by pertinently repeating the second cycle (IV) including providing the first gas (step S210), removing the remaining first gas (step S220), providing the second gas (step S230), removing the unreacted second gas (step S240), providing the third gas (step S250), removing the remaining third gas (step S260), providing the fourth gas (step S270) and removing the remaining fourth gas (step S280). Since the silicon nanocrystalline layers may be formed on the silicon-rich insulation layers having desired silicon contents and the undesired materials may be advantageously removed from the silicon-rich insulation layers, the silicon-rich nanocrystalline structure may have an improved silicon content and a desired uniform thickness.

Table 2 shows thicknesses and refractive indexes of the silicon-rich nanocrystalline structures relative to the numbers of the first cycle (III) and the second cycle (IV) in accordance with example embodiments of the present invention.

TABLE 2

| The number of the first cycle (III) | The number of the second cycle (IV) | Thickness (Å) | Refractive index |
| --- | --- | --- | --- |
| 2 | 10 | 70 | 2.33 |
| 5 | 10 | 75 | 2.29 |
| 10 | 10 | 95 | 2.32 |

As shown in Table 2, each of the silicon-rich insulation structures has a refractive index above about 2.2 so that the silicon-rich insulation structures have high silicon contents (silicon richness).

After repeatedly performing the first cycle (III) including forming the silicon-rich insulation layer and removing the undesired materials from the silicon-rich insulation layer, the silicon nanocrystalline layer is formed on the silicon-rich insulation layer. Thus, the silicon-rich insulation layer may have the desired thickness. That is, the thickness of the silicon-rich insulation layer may be increased in proportional to the numbers of the first cycle (III).

Table 3 shows contents of silicon, oxygen and nitrogen in a conventional silicon-rich oxide layer and silicon-rich oxide and silicon-rich oxynitride layers according to the present invention. Additionally, Table 3 shows refractive indexes of the conventional silicon-rich oxide layer and silicon-rich oxide and silicon-rich oxynitride layers according to the present invention. The contents of the silicon, the oxygen and the nitrogen are obtained using an X-ray photoelectron spectroscopy (XPS).

TABLE 3

|  | Refractive index | Si (%) | O (%) | N (%) |
| --- | --- | --- | --- | --- |
| Conventional silicon-rich oxide layer | 1.46 | 33.3 | 64.7 | 0.0 |
| Silicon-rich oxide layer | 2.13 | 49.1 | 46.4 | 0.0 |
| Silicon-rich oxynitride layer (A) | 2.36 | 44.2 | 32.0 | 18.1 |
| Silicon-rich oxynitride layer (B) | 2.37 | 44.6 | 38.2 | 12.5 |
| Silicon-rich oxynitride layer (C) | 2.36 | 45.0 | 41.1 | 7.7 |

In Table 3, the conventional silicon-rich oxide layer is formed using a silane gas. The silicon-rich oxide layer of the present invention is formed by 10 times performing a second cycle of an ALD process that includes a first cycle of the ALD process and providing a silane gas after 5 times executing the first cycle that includes providing an HCD gas and providing a nitrous oxide gas. The silicon-rich oxynitride layers of the present invention are obtained by 5 times performing a second cycle of an ALD process that includes a first cycle of the ALD process and providing a silane gas after 5 times executing the first cycle that includes providing an HCD gas, providing a nitrous oxide gas and providing an ammonia gas. Here, the silicon-rich oxynitride layers (A, B and C) are distinguished from one another. That is, the silicon-rich oxynitride layer (A) is formed using the ammonia gas with the height flow rate, whereas the silicon-rich oxynitride layer (C) is obtained using the ammonia gas with the lowest flow rate. Additionally, the silicon-rich oxynitride layer (B) is obtained using the ammonia gas with the intermediate flow rate As shown in Table 3, the conventional silicon-rich oxide layer formed using the silane gas has a concentration ratio between silicon and oxygen of about 1:2 and a refractive index of about 1.46. However, the silicon-rich oxide layers (A, B and C) have concentration ratios between silicon and oxygen below about 1:1 and refractive indexes above about 2.13. Particularly, the silicon-rich oxynitride layer (B) has the highest refractive index of about 2.36. The contents of the silicon and the oxygen in the silicon-rich oxynitride layers (A, B and C) may vary in accordance with the variation of the flow rate of the ammonia gas while the silicon contents in the silicon-rich oxynitride layers (A, B, C) may be constantly maintained. Therefore, when the nitrogen content in the silicon-rich oxynitride layer is optimized by controlling the flow rate of the ammonia gas, bonds of silicon-nitrogen may reduce undesired trap sites generated in the silicon-rich oxynitride layers so that the silicon-rich oxynitride layers may have stable electrical characteristics.

Method of Manufacturing a Non-volatile Semiconductor Device

Figure 6:
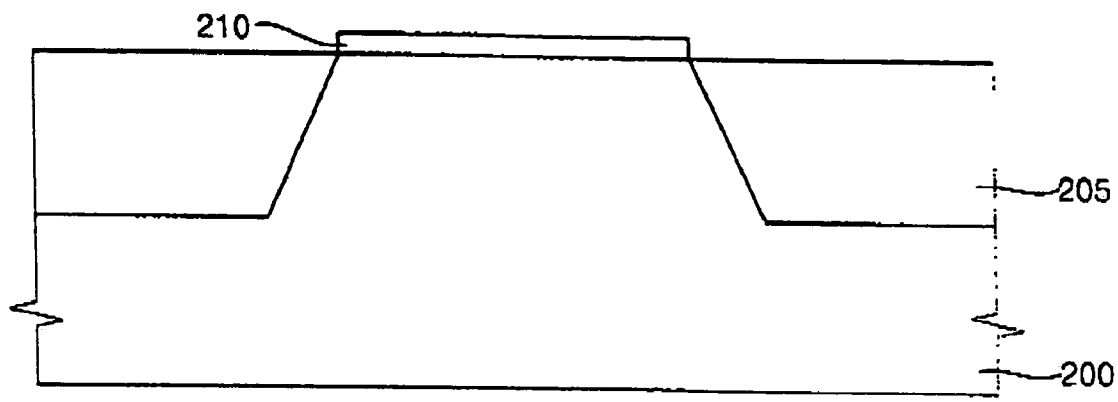
FIGS. 6 to 8 are cross-sectional views illustrating a method of manufacturing a non-volatile semiconductor device in accordance with example embodiments of the present invention.
Figure 7:
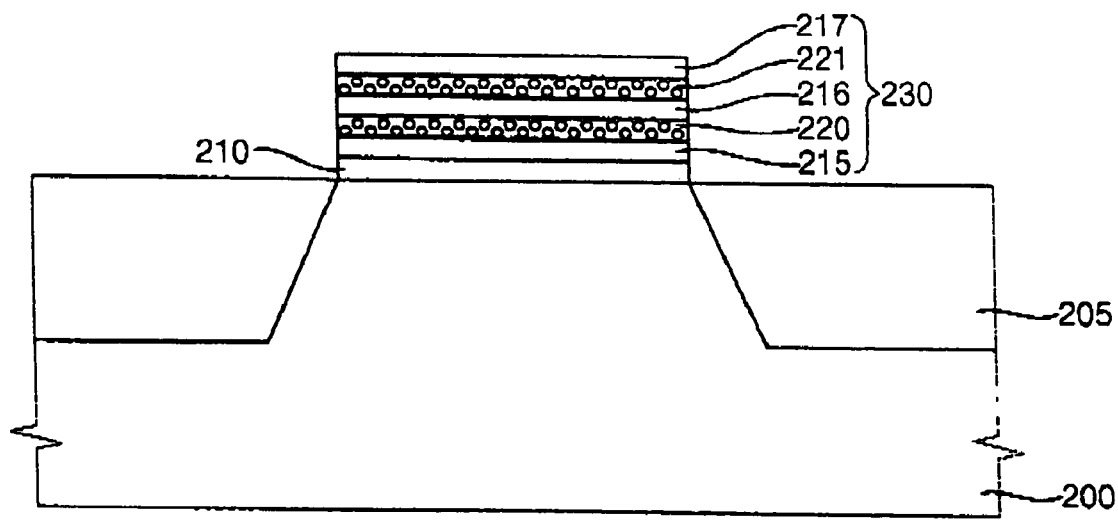
Figure 8:
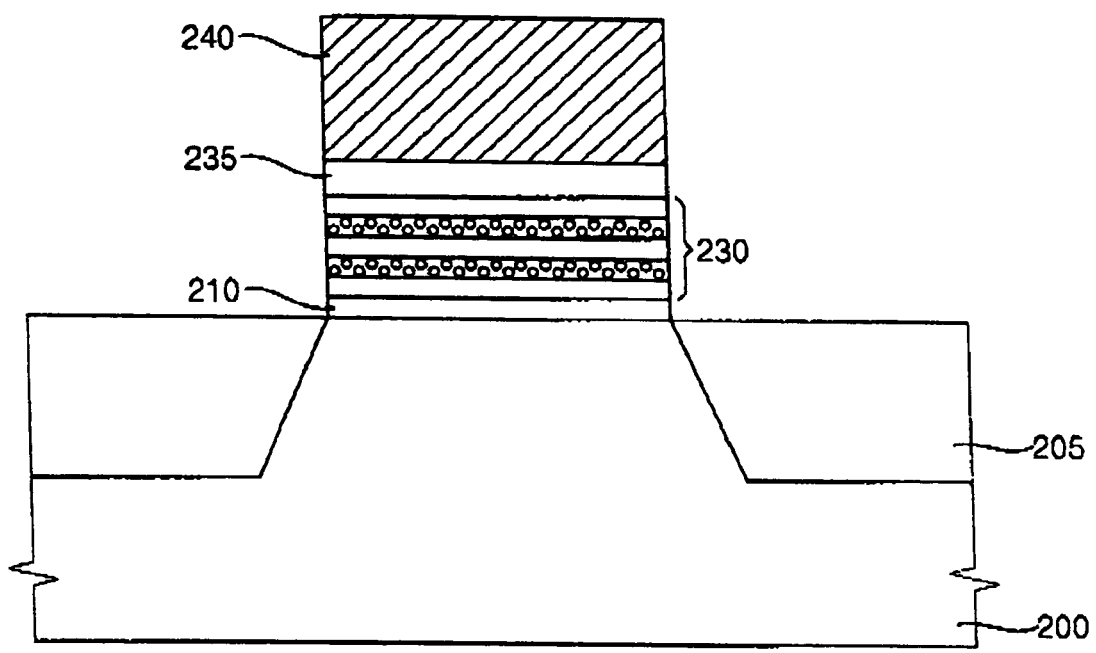

FIGS. 6 to 8 are cross-sectional views illustrating a method of manufacturing a non-volatile semiconductor memory device in accordance with example embodiments of the present invention.

Referring to FIG. 6, an isolation layer 205 is formed on a substrate 200 to define an active region and an isolation region of the substrate 200. The substrate 200 may include a silicon wafer or an SOI substrate. The isolation layer 205 may be formed by a thermal oxidation process or a shallow trench isolation (STI) process.

A tunnel dielectric layer 202 is formed on the active region of the substrate 200. In one example embodiment of the present invention, the tunnel dielectric layer 202 may be formed using a silicon compound such as silicon oxide or silicon oxynitride. In another example embodiment of the present invention, the tunnel dielectric layer 202 may be formed using a metal oxide having a high dielectric constant.

For example, the tunnel dielectric layer 202 may be formed using hafnium oxide, zirconium oxide, aluminum oxide, etc.

Referring to FIG. 7, a charge trapping structure 230 is formed on the tunnel dielectric layer 202. The charge trapping structure 230 may have a construction substantially the same as the above-described silicon-rich nanocrystalline structure. Additionally, the charge trapping structure 230 may be formed processes substantially the same as those for forming the above-described silicon-rich nanocrystalline structure.

In some example embodiments of the present invention, the charge trapping structure 230 includes a plurality of silicon-rich insulation layers 215, 216 and 217, and a plurality of silicon nanocrystalline layers 220 and 221 alternately formed on the tunnel dielectric layer 202.

In one example embodiment of the present invention, the charge trapping structure 230 may be formed by repeatedly performing a second cycle of an ALD process including a first cycle of the ALD process and providing a third gas containing silicon after repeatedly executing the first cycle including providing a first gas containing HCD and providing a second gas containing oxygen.

In another example embodiment of the present invention, the charge trapping structure 230 may be formed by repeatedly performing a second cycle of an ALD process including a first cycle of the ALD process and providing a fourth gas containing silicon after repeatedly executing the first cycle including providing a first gas containing HCD, providing a second gas containing oxygen and providing a third gas containing hydrogen.

In the charge trapping structure 230 according to some example embodiments of the present invention, the silicon nanocrystalline layers 220 and 221 may serve as a floating gate in a conventional non-volatile semiconductor device.

In one example embodiment of the present invention, the charge trapping structure 230 may be thermally treated to increase an amount of silicon nanocrystals in the silicon nanocrystalline layers and to cure undesired trap sites in the silicon-rich insulation layers. For example, the charge trapping structure 230 may be thermally treated at a temperature of about 800 to about 1,000° C. for about 10 to about 90 minutes under an atmosphere including nitrogen. Thus, a non-volatile semiconductor device including the thermally treated charge trapping structure 230 may have improved programming and erasing operations.

In another example embodiment of the present invention, the charge trapping structure 230 may be preliminarily oxidized under an atmosphere including nitrogen and oxygen so as to prevent the charge trapping structure 230 from excessively being oxidized in subsequent processes. Hence, the non-volatile semiconductor device including the preliminarily oxidized charge trapping structure 230 may have an enhanced data retention capability.

In still another example embodiment of the present invention, the charge trapping structure 230 may be flash annealed to increase the amount of silicon nanocrystals in the silicon nanocrystalline layers. For example, the charge trapping structure 230 may be flash annealed at a temperature of about 20 to about 500° C. for about 5 to about 20 microseconds. Therefore, the non-volatile semiconductor device including the flash annealed charge trapping structure 230 may have improved programming and erasing operations and an enhanced data retention capability.

Referring to FIG. 8, a blocking dielectric layer 235 is formed on the charge trapping layer structure 230. The blocking dielectric layer 235 may prevent charges in a control gate 240 from being moved into the charge trapping structure 230.

The blocking dielectric layer 235 may be formed using a silicon compound such as silicon oxide or silicon oxynitride. Alternatively, the blocking dielectric layer 235 may be formed using a metal oxide having a high dielectric constant such as hafnium oxide, zirconium oxide, aluminum oxide, etc.

The control gate 240 is formed on the blocking dielectric layer 235 using a conductive material. For example, the control gate 240 may be formed using polysilicon doped with impurities, metal or metal nitride.

Impurities are implanted into portions of the substrate 200 adjacent to the tunnel dielectric layer 202 to form source/drain regions 205 at the portions of the substrate 200. Therefore, the non-volatile semiconductor device is formed on the substrate 200.

Hereinafter, programming, reading and erasing operations of the non-volatile semiconductor device having the above construction will be illustrated in detail.

In the programming operation of the non-volatile semiconductor device, a voltage is applied to the control gate 140 and a source region whereas a drain region is grounded. Hot electrons may be generated in a region adjacent to the source region. The hot electrons overcome an energy barrier of the tunnel dielectric layer 202, and then are injected into the silicon nanocrystalline layers 220 and 221 adjacent to the source region. When the hot electrons are injected into the silicon nanocrystalline layers 220 and 221, a threshold voltage Vth of the non-volatile semiconductor device may increase so that data may be stored in the non-volatile semiconductor device.

Since the silicon nanocrystalline layers 220 and 221 are electrically spaced apart from each other by the silicon-rich insulation layers 215, 216 and 217, the hot electrons in one of the silicon nanocrystalline layers 220 and 221 may not move into another of the silicon nanocrystalline layers 220 and 221 in the programming operation of the non-volatile semiconductor device.

Alternatively, the source region and the drain region may be grounded in the programming operation of the non-volatile semiconductor device. A voltage may be applied to the control gate 240 and the substrate 200 to cause the FN tunneling effect, thereby programming the non-volatile semiconductor device. Here, the hot electrons may be uniformly injected into the silicon nanocrystalline layers 220 and 221 due to the FN tunneling effect.

In the reading operation of the non-volatile semiconductor device, a voltage is applied to the control gate 240 and the drain region whereas the source region may be earthed. Here, a gate voltage Vg applied to the control gate 240 may be lower than the threshold voltage Vth of the non-volatile semiconductor device generated under a condition in which the hot electrons are injected into the silicon nanocrystalline layers 220 and 221. Since a channel current may not flow through a memory cell having the silicon nanocrystalline layers 220 and 221 into which the hot electrons are injected, data "0" may be obtained from the memory cell. Since the channel current may flow through another memory cell having the silicon nanocrystalline layers into which the hot electrons may not be injected, data "1" may be obtained from another memory cell.

The erasing operation of the non-volatile semiconductor device may be carried out by a hot electron injection method. That is, a negative voltage may be applied to the control gate 240 to generate hot holes in a region adjacent to the source region. The hot holes may overcome the energy barrier of the tunnel dielectric layer 202 due to the negative voltage applied to the control gate 240, and then may be injected into the silicon nanocrystalline layers 220 and 221 adjacent to the source region. The hot holes in the silicon nanocrystalline layers 220 and 221 may remove the hot electrons in the silicon nanocrystalline layers 220 and 221. Alternatively, a negative voltage may be applied to the control gate 240, whereas a positive voltage may be applied to the substrate 200 to generate the FN tunneling effect, thereby erasing the data stored in the non-volatile semiconductor device. That is, the hot electrons in the silicon nanocrystalline layers 220 and 221 may be removed by the FN tunneling effect.

According to the present invention, a silicon-rich nanocrystalline structure may include at least one silicon-rich insulation layer and at least one silicon nanocrystalline layer alternately formed on an object or a substrate or a tunnel dielectric layer. The at least one silicon-rich insulation layer and the at least one silicon nanocrystalline layer may be formed by atomic layer deposition processes using first gases capable of widening a silicon content in a wide range. In addition, the silicon-rich nanocrystalline structure may have a high silicon content and a good step coverage. When the silicon-rich nanocrystalline structure is employed as a charge trapping structure of a non-volatile semiconductor device, the non-volatile semiconductor device may have improved programming and erasing operations and also an enhanced data retention capability.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of this invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a silicon-rich nanocrystalline structure by an atomic layer deposition (ALD) process, comprising:
   providing a first gas comprising a first silicon compound onto an object to form a silicon-rich chemisorption layer on the object;
   providing a second gas comprising oxygen onto the silicon-rich chemisorption layer to form a silicon-rich insulation layer on the object; and
   providing a third gas comprising a second silicon compound onto the silicon-rich insulation layer to form a silicon nanocrystalline layer on the silicon-rich insulation layer.

2. The method of claim 1, wherein the first silicon compound comprises two silicon atoms.

3. The method of claim 2, wherein the first silicon compound comprises hexachlorodisilane (HCD; $Si_2Cl_6$).

4. The method of claim 1, wherein the second gas comprises a nitrous oxide ($N_2O$) gas or an oxygen ($O_2$) gas.

5. The method of claim 1, wherein the second silicon compound comprises silicon and hydrogen.

6. The method of claim 5, wherein the second silicon compound comprises silane ($SiH_4$).

7. The method of claim 1, prior to providing the third gas, further comprising repeating providing the first gas and providing the second gas to adjust a silicon content of the silicon-rich insulation layer.

8. The method of claim 1, wherein sizes of silicon nanocrystals and density of the silicon nanocrystals in the silicon nanocrystalline layer are adjusted by a flow rate of the third gas.

9. The method of claim 1, further comprising repeating providing the first gas, providing the second gas and providing the third gas to alternately form a plurality of silicon-rich insulation layers and a plurality of silicon nanocrystalline layers on the object.

10. The method of claim 1, prior to providing the third gas, further comprising removing undesired materials from the silicon-rich insulation layer.

11. The method of claim 10, wherein removing the undesired materials comprises providing a hydrogen containing gas onto the silicon-rich insulation layer.

12. The method of claim 11, wherein the hydrogen containing gas comprises at least one selected from the group consisting of an ammonia ($NH_3$) gas, a hydrogen ($H_2$) gas and a deuterium ($D_2$) gas.

13. The method of claim 1, further comprising thermally treating the silicon-rich nanocrystalline structure.

14. The method of claim 13, wherein the silicon-rich nanocrystalline structure is thermally treated at a temperature of about 800 to about 1,100° C. for about 10 to about 90 minutes under an atmosphere including nitrogen.

15. The method of claim 1, further comprising preliminarily oxidizing the silicon-rich nanocrystalline structure.

16. The method of claim 15, wherein the silicon-rich nanocrystalline structure is preliminarily oxidized under an atmosphere including nitrogen and oxygen.

17. The method of claim 1, further comprising flash annealing the silicon-rich nanocrystalline structure.

18. The method of claim 17, wherein the silicon-rich nanocrystalline structure is flash annealed at a temperature of about 20 to about 500° C. for about 5 to about 20 microseconds.

19. A method of manufacturing a non-volatile semiconductor device, comprising:
   forming a tunnel dielectric layer on a semiconductor substrate;
   forming a charge trapping structure on the tunnel dielectric layer by an ALD process; and
   forming a control gate on the charge trapping structure,
   wherein forming the charge trapping structure comprises:
      providing a first gas comprising a first silicon compound onto the tunnel dielectric layer to form a silicon-rich chemisorption layer on the tunnel dielectric layer;
      providing a second gas comprising oxygen onto the silicon-rich chemisorption layer to form a silicon-rich insulation layer on the tunnel dielectric layer; and
      providing a third gas comprising a second silicon compound onto the silicon-rich insulation layer to form a silicon nanocrystalline layer on the silicon-rich insulation layer.

20. The method of claim 19, wherein the first silicon compound differs from the second silicon compound.

21. The method of claim 20, wherein the first silicon compound comprises two silicon atoms.

22. The method of claim 20, wherein the second silicon compound comprises one silicon atom and hydrogen.

23. The method of claim 20, wherein the first silicon compound comprises HCD, and the second silicon compound comprises silane.

24. The method of claim 19, wherein the second gas comprises an $N_2O$ gas or an $O_2$ gas.

25. The method of claim 19, prior to providing the third gas, further comprising repeating providing the first gas and providing the second gas at least once to adjust a silicon content of the silicon-rich insulation layer.

26. The method of claim 19, wherein sizes of silicon nanocrystals and density of the silicon nanocrystals in the silicon nanocrystalline layer are adjusted by a flow rate of the third gas.

27. The method of claim 19, further comprising repeating providing the first gas, providing the second gas and providing the third gas to alternately form the charge trapping structure including a plurality of silicon-rich insulation layers and a plurality of silicon nanocrystalline layers on the tunnel dielectric layer.

28. The method of claim 19, prior to providing the third gas, further comprising removing undesired materials from the silicon-rich insulation layer.

29. The method of claim 28 wherein removing the undesired materials comprises providing a hydrogen containing gas onto the silicon-rich insulation layer.

30. The method of claim 29, wherein the hydrogen containing gas comprises at least one selected from the group consisting of an $NH_3$ gas, an $H_2$ gas and a $D_2$ gas.

31. The method of claim 19, further comprising thermally treating the charge trapping structure under an atmosphere including nitrogen.

32. The method of claim 19, further comprising preliminarily oxidizing the charge trapping structure under an atmosphere including nitrogen and oxygen.

33. The method of claim 19, further comprising flash annealing the charge trapping structure for about 5 to about 20 microseconds.

34. The method of claim 19, prior to forming the control gate, further comprising forming a blocking dielectric layer on the charge trapping structure.

35. The method of claim 34, wherein the blocking dielectric layer is formed using a silicon compound or a metal oxide.

* * * * *